(12) United States Patent
Lin

(10) Patent No.: US 7,511,958 B2
(45) Date of Patent: Mar. 31, 2009

(54) HEAT DISSIPATING ASSEMBLY OF HEAT DISSIPATING DEVICE

(76) Inventor: Cheng-Hsing Lin, 235 Chung-Ho, Box 8-24 Taipei (TW)

( * ) Notice: Subject to any disclaimer, the term of this patent is extended or adjusted under 35 U.S.C. 154(b) by 212 days.

(21) Appl. No.: 11/443,418

(22) Filed: May 31, 2006

(65) Prior Publication Data

US 2007/0279867 A1 Dec. 6, 2007

(51) Int. Cl.
*H05K 7/20* (2006.01)
*F28F 7/00* (2006.01)

(52) U.S. Cl. ............ 361/700; 165/104.33; 361/719

(58) Field of Classification Search .............. 361/700
See application file for complete search history.

(56) References Cited

U.S. PATENT DOCUMENTS 5,339,214 A * 8/1994 Nelson ................... 361/695
5,983,995 A * 11/1999 Shutou et al. .......... 165/104.33
6,373,700 B1 * 4/2002 Wang .................... 361/698
6,381,135 B1 * 4/2002 Prasher et al. ........... 361/700
6,650,540 B2 * 11/2003 Ishikawa ................ 361/695
6,830,098 B1 * 12/2004 Todd et al. ............ 165/104.33
6,883,594 B2 * 4/2005 Sarraf et al. .......... 165/104.33
7,028,758 B2 * 4/2006 Sheng et al. ........... 165/104.21
7,143,819 B2 * 12/2006 Malone et al. ........ 165/104.33

* cited by examiner

*Primary Examiner*—Gregory D Thompson

(57) ABSTRACT

A heat dissipating assembly of a heat dissipating device includes an integral formed plastic retaining seat; and a heat conductive tube. A part of one end of a heat conductive tube is embedded into the plastic retaining seat and another end of the heat conductive tube is connected to a heat dissipation device. In using, the heat conductive tube is placed above the heat source. Wherein heat dissipated from the heat source is transferred to the heat conductive tube and then to the heat dissipation device so as to be dissipating out; and thus the heat source has a stable working environment. The plastic retaining seat is used to replace the prior art metal seat, which is easily manufactured and is light. Thus the cost is low and the size thereof is compact. Moreover, few steps are necessary in manufacture and the cost in assembly is low.

5 Claims, 4 Drawing Sheets

HEAT DISSIPATING ASSEMBLY OF HEAT DISSIPATING DEVICE

FIELD OF THE INVENTION

The present invention relates to heat dissipation, in particular to a heat dissipating assembly of a heat dissipating device, wherein a plastic retaining seat is used to replace the prior art metal seat, which is easily manufactured and is light. Thus the cost is low and the size thereof is compact. Moreover, less steps are necessary in manufacture and the cost in assembly is low.

BACKGROUND OF THE INVENTION

Portable electronic devices are more and more popular. However each portable electronic device has an operation kernel with high operation frequency. However these operation kernel will dissipate a large amount of heat. Thereby there is an eager demand for dissipating the heat from the kernel effectively. Thus, in the prior art, a metal base serves to located the heat dissipating kernel and then a heat dissipating tube of a heat dissipation device is pressed to the seat so as to dissipate heat from the heat dissipation kernel. Thus heat is dissipated effectively. However in current trend, the portable device is necessary to be made with a compact size and is light. These prior art devices can not achieve the requirement and is not competitive in markets.

SUMMARY OF THE INVENTION

Accordingly, the primary object of the present invention is to provide a heat dissipating assembly of a heat dissipating device, wherein a plastic retaining seat is used to replace the prior art metal seat, which is easily manufactured and is light. Thus the cost is low and the size thereof is compact. Moreover, less steps are necessary in manufacture and the cost in assembly is low.

To achieve above object, the present invention provides a heat dissipating assembly of a heat dissipating device which comprises an integral formed plastic retaining seat; and a heat conductive tube; a part of one end of a heat conductive tube embedded into the plastic retaining seat and another end of the heat conductive tube being connected to a heat dissipation device; in using the heat conductive tube being placed above the heat source and thus heat from the heat source is absorbed by the heat conductive tube; wherein heat dissipated from the heat source is transferred to the heat conductive tube and then to the heat dissipation device so as to be dissipating out; and thus the heat source 18 has a stable working environment. A buckle can be included. Two ends of the buckle being buckled to two recesses at two sides of the plastic retaining seat and a middle section of the buckle passes through an upper surfaces of the plastic retaining seat and the part of the heat conductive tube embedded into the plastic retaining seat so as to fix the heat conductive tube to the plastic retaining seat.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
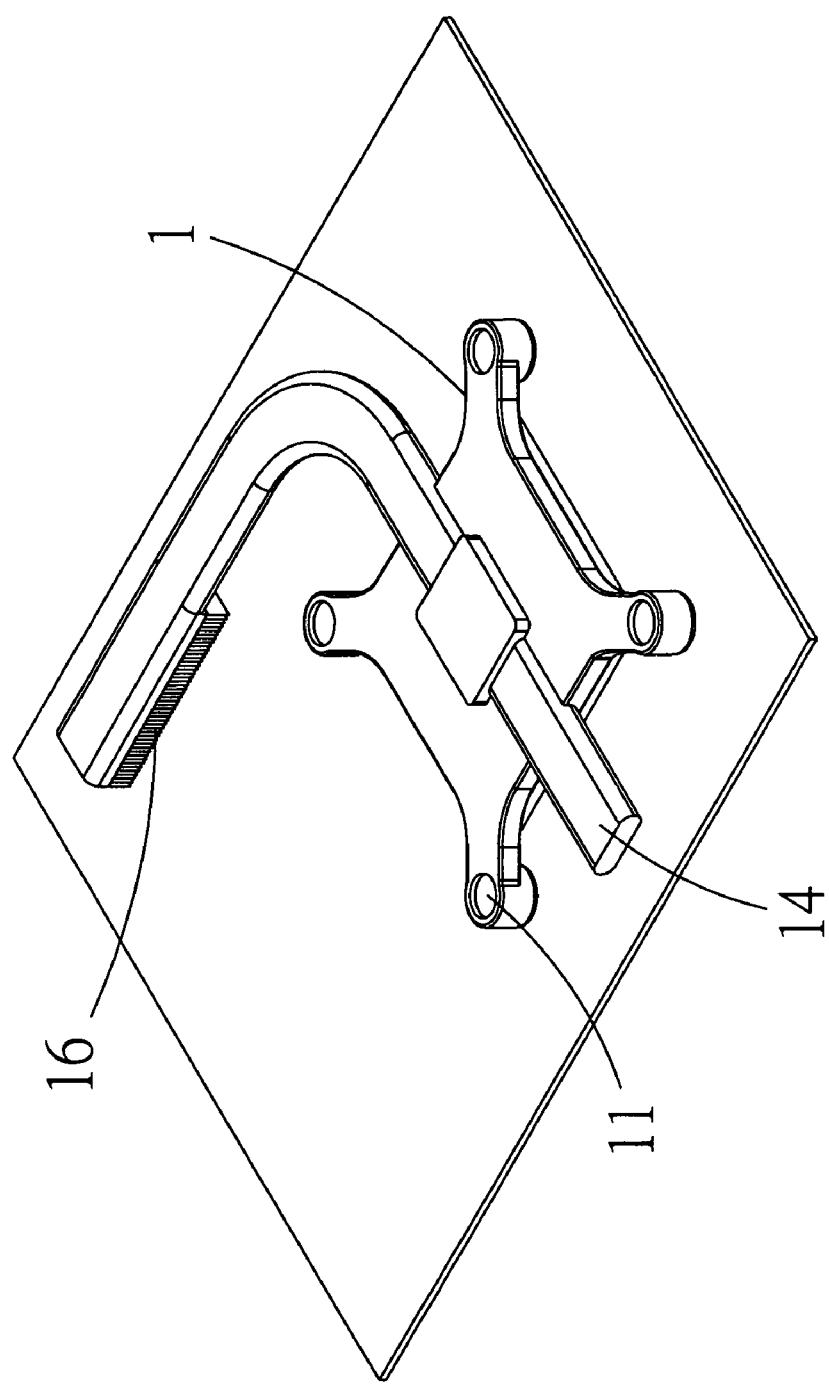
FIG. 1 is a schematic view of a first embodiment of the present invention.
Figure 2:
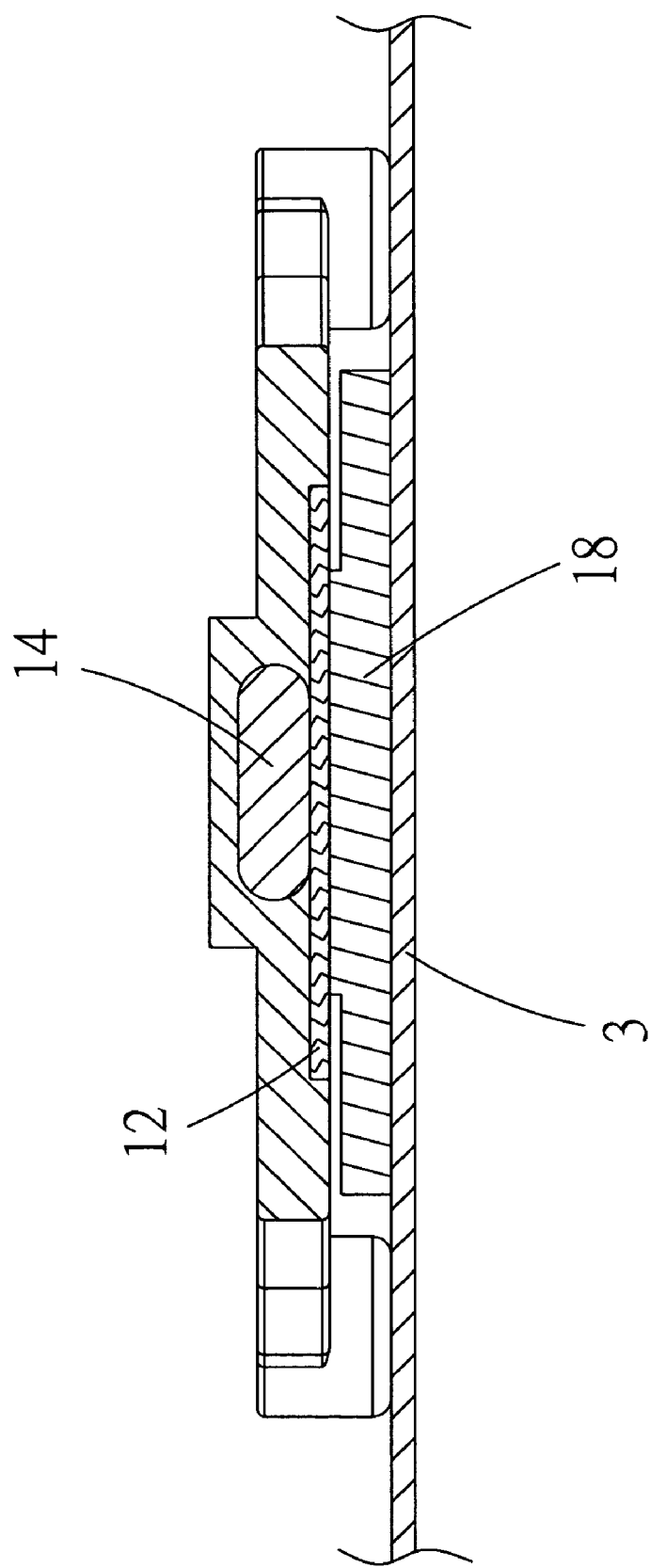
FIG. 2 is a cross sectional view of the first embodiment of the present invention.

Referring to FIGS. 1 and 2, a base of a heat dissipating device of the present invention is illustrated. The present invention has the following elements.

An integral formed plastic retaining seat 1 has a plurality of holes 11.

A part of one end of a heat conductive tube 14 is embedded into the plastic retaining seat 1 and another end of the heat conductive tube 14 is connected to a heat dissipation device 16. When a heat source 18 (such as a central processing unit) is fixed to a carrier 3 (such as a mother board). The plastic retaining seat 1 is fixed to the carrier 3 by screwing screws to the holes and then into the carrier 3. Thereby the heat conductive tube 14 is placed above the heat source 18 and thus heat from the heat source 18 is absorbed by the heat conductive tube 14.

A heat conductive block 12 is installed between the heat conductive tube 14 and the heat source 18 so as to increase a heat dissipating area from the heat source 18 to the heat conductive tube 14. Thus heat is dissipated from the heat source 18, the heat conductive block 12, the heat conductive tube 14 and then to the heat dissipation device 16 so as to be dissipating out. Thus the heat source 18 has a stable working environment.

Figure 3:
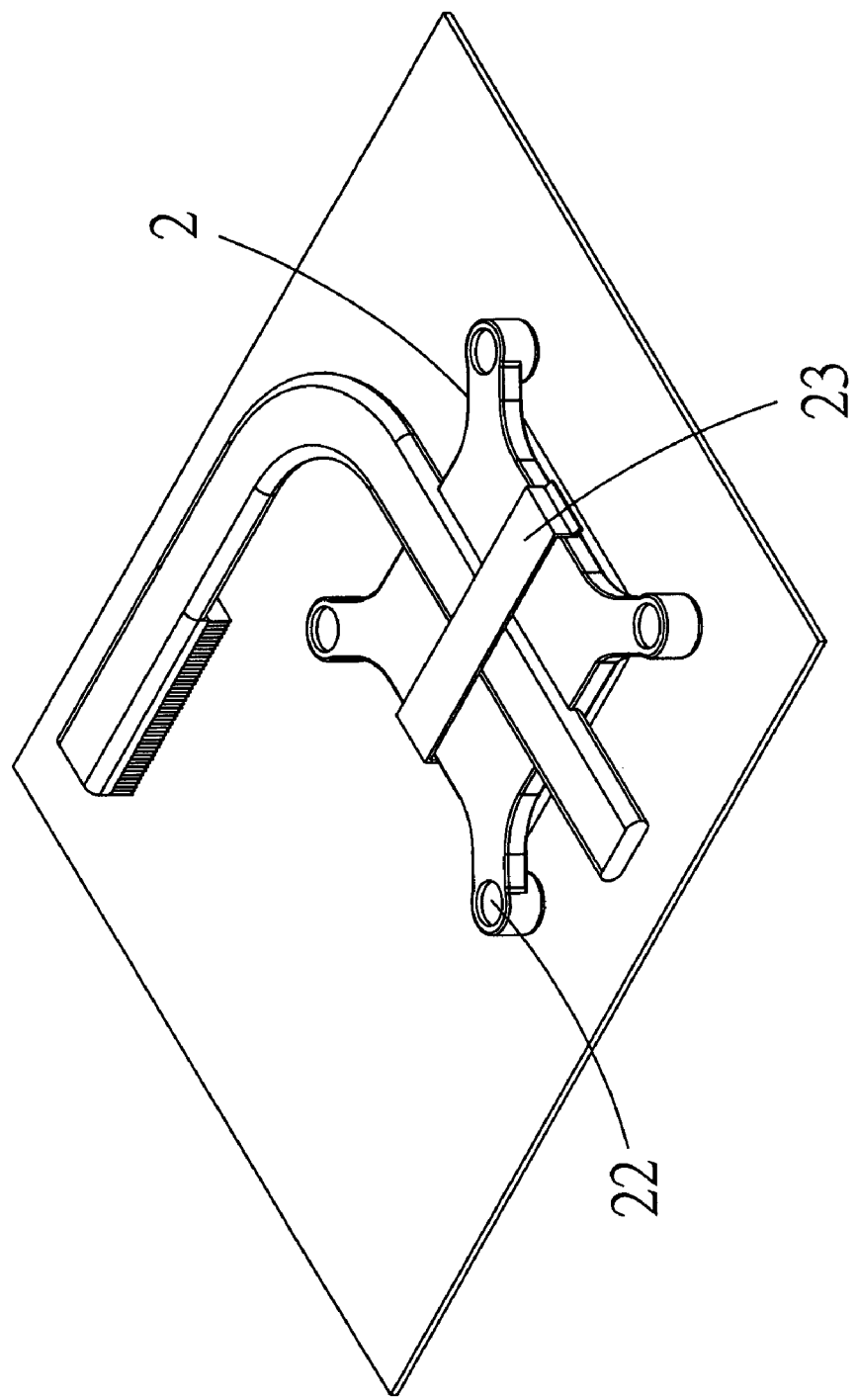
FIG. 3 is a schematic perspective view of the second embodiment of the present invention.
Figure 4:
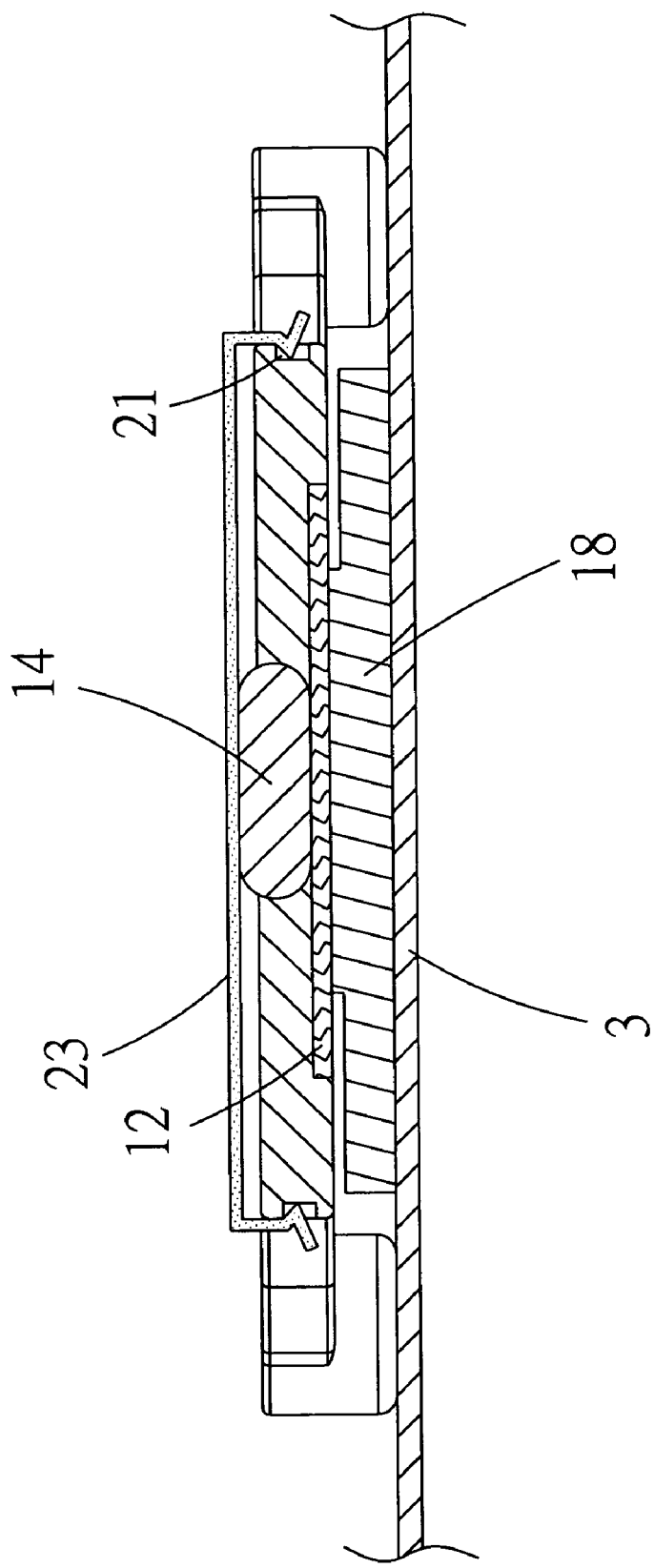
FIG. 4 is a schematic cross sectional view of the second embodiment of the present invention.

Referring to FIGS. 3 and 4, another embodiment of the present invention is illustrated. Those identical to above embodiment will not be further described herein. Only those differences in these two embodiments are described. In this embodiment, the plastic retaining seat 2 is a single element. Each of two sides of the plastic retaining seat 1 has a recess. Two ends of a plastic or metal buckle are buckled to the two recesses and a middle section of the buckle passes through an upper surfaces of the plastic retaining seat 2 so as to fix the heat conductive tube 14 to the plastic retaining seat 2. The plastic retaining seat 1 is fixed to the carrier 3 by screwing screws to the holes and then into the carrier 3. Thereby the heat conductive tube 14 and heat conductive block 12 are placed above the heat source 18 and thus heat from the heat source 18 is absorbed by the heat conductive tube 14. Thus the heat from the heat source 18 can be dissipated effectively and the heat source 18 has stable working temperature. Two ends of a buckle 23 are inserted into two recesses 21 at two lateral sides of the plastic retaining seat 1 and a middle section of the buckle 23 passes through an upper surfaces of the plastic retaining seat 1 and an upper side of the heat conductive tube 14 so as to fix the heat conductive tube 14 to the plastic retaining seat 1.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat dissipating assembly of a heat dissipating device comprising;

a carrier;

an integral formed plastic retaining seat 1 located upon the carrier;

a heat conductive tube; a lower part of one end of a heat conductive tube embedded into the plastic retaining seat and an upper end of the heat conductive tube being connected to the heat dissipation device located upon the carrier and below the heat conductive tube; in using the heat conductive tube being placed above a heat source; and thus heat from the heat source is absorbed by the heat conductive tube; wherein heat dissipated from the heat source is transferred to the heat conductive tube and then to the heat dissipation device so as to be dissipating out; and thus the heat source has a stable working environment;

wherein a heat conductive block is installed between the heat conductive tube and the heat source so as to increase a heat dissipating area from the heat source to the heat conductive tube.

2. A heat dissipating assembly of a heat dissipating device comprising;

a carrier;

an integral formed plastic retaining seat located upon the carrier;

a heat conductive tube; a lower part of one end of a heat conductive tube embedded into and being in contact with the plastic retaining seat in the forming of the integral formed plastic retaining seat and an upper end of the heat conductive tube being connected to the heat dissipation device located upon the carrier and below the heat conductive tube; in using the heat conductive tube being placed above the heat source and thus heat from the heat source is absorbed by the heat conductive tube; and wherein heat dissipated from the heat source is transferred to the heat conductive tube and then to the heat dissipation device so as to be dissipated out; and thus the heat source has a stable working environment; and wherein a heat conductive block is installed between the heat conductive tube and the heat source so as to increase a heat dissipating area from the heat source to the heat conductive tube.

3. A heat dissipating assembly of a heat dissipating device comprising;

a carrier;

a plastic retaining seat located upon the carrier;

a heat conductive tube; a lower part of one end of a heat conductive tube embedded into the plastic retaining seat and an upper end of the heat conductive tube being connected to the heat dissipation device located upon the carrier and below the heat conductive tube; in using the heat conductive tube being placed above a heat source; and thus heat from the heat source 18 is absorbed by the heat conductive tube; and wherein heat dissipated from the heat source is transferred to the heat conductive tube and then to the heat dissipation device so as to be dissipated out; and thus the heat source 18 has a stable working environment;

wherein the heat conductive tube is fixed to the plastic retaining seat by using a buckle; and two ends of the buckle being inserted into two recesses at two lateral sides of the plastic retaining seat and a middle section of the buckle passes through an upper surfaces of the plastic retaining seat and an upper side of the heat conductive tube so as to fix the heat conductive tube to the plastic retaining seat.

4. The heat dissipating assembly of a heat dissipating device as claimed in claim 3, wherein the buckle is made of metal, plastics and the combination of metal and plastics.

5. The heat dissipating assembly of a heat dissipating device as claimed in claim 3, wherein a heat conductive block is installed between the heat conductive tube and the heat source so as to increase a heat dissipating area from the heat source to the heat conductive tube.

* * * * *